United States Patent
Okabe (10) Patent No.: US 11,081,181 B2
(45) Date of Patent: Aug. 3, 2021

(54) FLASH MEMORY AND METHOD FOR OPERATING THE SAME

(71) Applicant: Winbond Electronics Corp., Taichung (TW)

(72) Inventor: Sho Okabe, Yokohama (JP)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/906,406

(22) Filed: Jun. 19, 2020

(65) Prior Publication Data

US 2020/0402578 A1    Dec. 24, 2020

(30) Foreign Application Priority Data

Jun. 20, 2019    (JP) .............................. JP2019-114682

(51) Int. Cl.
| | | |
|---|---|---|
| *G11C 16/04* | (2006.01) | |
| *G11C 16/26* | (2006.01) | |
| *G11C 16/14* | (2006.01) | |
| *G11C 16/24* | (2006.01) | |
| *G11C 16/10* | (2006.01) | |
| *G11C 11/56* | (2006.01) | |

(52) U.S. Cl.
CPC .......... *G11C 16/0483* (2013.01); *G11C 16/10* (2013.01); *G11C 16/14* (2013.01); *G11C 16/24* (2013.01); *G11C 16/26* (2013.01); *G11C 11/5621* (2013.01)

(58) Field of Classification Search
CPC ..... G11C 16/0483; G11C 16/10; G11C 16/14; G11C 16/24; G11C 16/26; G11C 11/5621
See application file for complete search history.

(56) References Cited

U.S. PATENT DOCUMENTS

| | | | |
|---|---|---|---|
| 5,798,968 A * | 8/1998 | Lee ......................... | G11C 5/025 |
| | | | 257/E27.103 |
| 9,431,098 B1 | 8/2016 | Fritsch et al. | |
| 9,799,406 B2 * | 10/2017 | Sato ........................ | G11C 16/08 |
| 2016/0064452 A1 | 3/2016 | Ueda et al. | |
| 2020/0402583 A1 * | 12/2020 | Arakawa ................. | G11C 16/16 |

FOREIGN PATENT DOCUMENTS

| | | |
|---|---|---|
| JP | 2014-53565 A | 3/2014 |
| TW | 201106361 A1 | 2/2011 |

* cited by examiner

*Primary Examiner* — Pho M Luu
(74) *Attorney, Agent, or Firm* — Birch, Stewart, Kolasch & Birch LLP (57) ABSTRACT

A flash memory of the invention has a plurality of planes, a controller, a switch unit, and a driving control circuit. The controller is configured to select at least one of the planes. The switch unit is configured to electrically connect bit lines of the unselected plane to a reference voltage. The driving control circuit is configured to commonly provide a gate select signal to select transistors of the selected planes and the unselected planes after the bit lines of the unselected plane is electrically connected to the reference voltage. A flash memory that can reliably seek stability of threshold distribution of memory is provided.

12 Claims, 10 Drawing Sheets

|  | erasing | writing | reading |
|---|---|---|---|
| selected W/L | 0 | 15~20V | 0 |
| unselected W/L | F | 10V | 4.5V |
| SGD | F | VDD | 4.5V |
| SGS | F | 0 | 4.5V |
| SL | F | VDD | 0 |
| P-well | 21V | 0 | 0 |

FLASH MEMORY AND METHOD FOR OPERATING THE SAME

CROSS REFERENCE TO RELATED APPLICATIONS

This application claims priority of Japanese Patent Application No. 2019-114682, filed on Jun. 20, 2019, the entirety of which is incorporated by reference herein.

BACKGROUND OF THE INVENTION

Field of the Invention

The present invention relates to a flash memory and a method for operating the same, and, in particular, to a flash memory including a plurality of planes and a method for operating the same.

Description of the Related Art

A NAND-type flash memory comprises a memory cell array. The memory cell array comprises a plurality of blocks. Each block forms a plurality of NAND strings. Each string is formed by a plurality of memory cells connected between the bit-line-side select transistor and the source-line-side select transistor. Due to the miniaturization of flash memory, the distance between the bit-line-side/source-line-side select transistor and the memory cell is getting smaller. This can easily cause the drain of the bit-line-side/source-line-side select transistor to generate gate-induced drain leakage (GIDL). It may also cause electrons to be injected into the floating gate of the adjacent memory cell. This in turn causes the threshold of the memory cell to change, or it causes a writing error. In order to minimize such problems, Patent Document 1 (JP2014053565A) discloses a dummy cell that is irrelevant to the data memory configured between the bit-line-side/source-line-side select transistor and the adjacent memory cell.

In a NAND-type flash memory, the amount of memory capacity can be by increasing the number of blocks in the memory cell array. However, if the number of blocks is increased, the length of the global bit line that extends in the block-arrangement direction becomes longer, and the speed of operations such as reading becomes slower, due to the increase in load capacitance. Therefore, in order to increase the amount of memory capacity and restrain the load capacitance of the global bit line, the memory cell array is divided into a plurality of numbers, and a certain number of blocks are formed in the divided memory cell arrays.

In a multi-plane flash memory that divides the memory cell array into a plurality of numbers, a plurality of planes are formed in one chip. In one plane, the memory cell array, the column decoding/driving circuit, the row decoder, the page buffer/sensing circuit etc. each has functions to perform. In addition, the controller or the input/output circuit can be shared by a plurality of planes. The controller or the address decoder etc. selects one or more planes among the plurality of planes based on the input row address information, and controls the reading operation, the programming operation, or the erasing operations in the selected plane. For example, the selection of a plane is based on the address that is input externally. The controller selects one plane, or it selects a plurality of planes at the same time.

Figure 1:
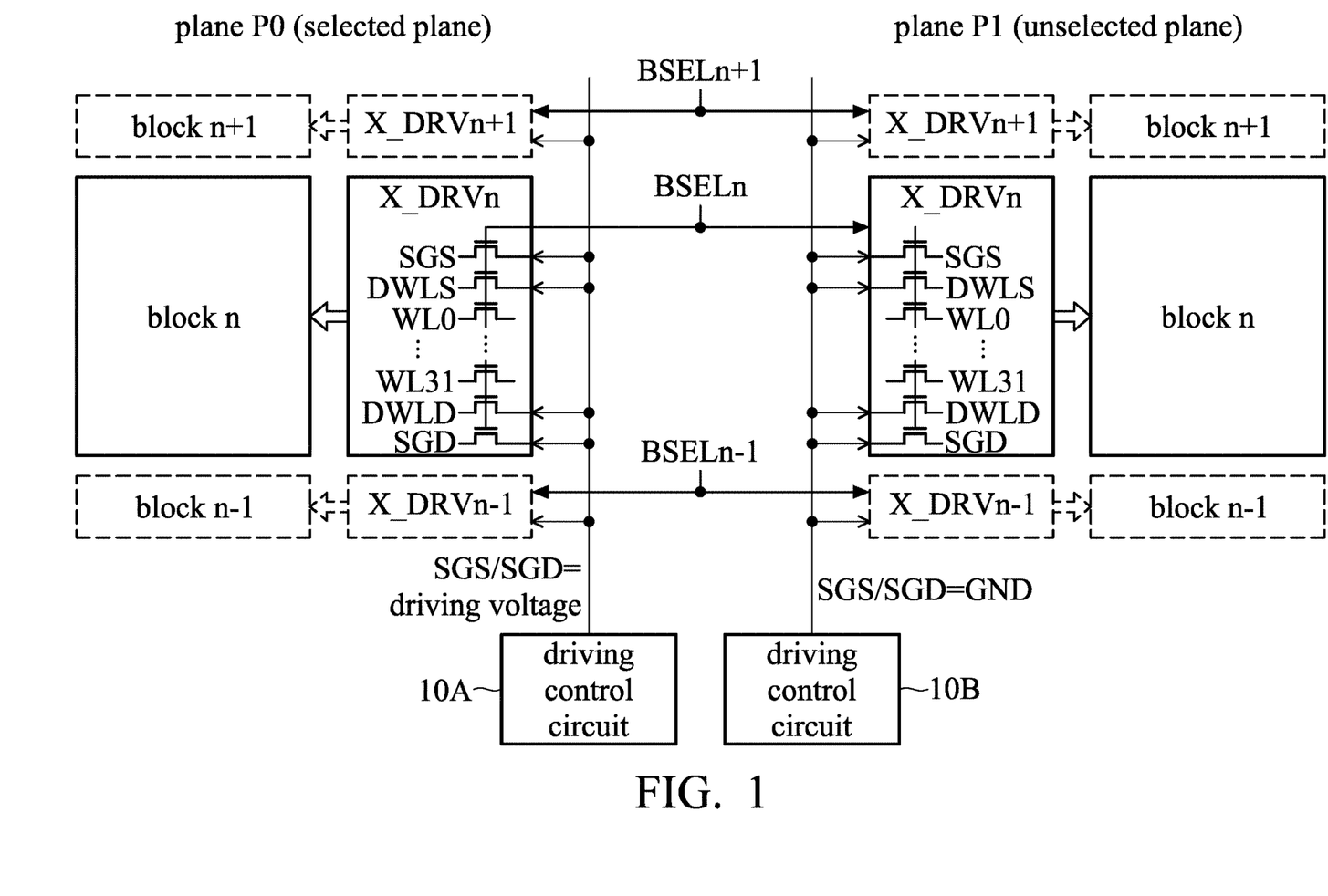
FIG. 1 shows a schematic view of the conventional multi-plane flash memory.

FIG. 1 shows a schematic view of a flash memory having two planes, P0 and P1. Plane P0 and plane P1 each has multiple blocks (n−1, n, n+1), multiple column driving circuits (X_DRVn−1, X_DRVn, X_DRVn+1) for driving the word lines WL0~WL31 of these blocks, and a driving control circuit 10A (or 10B) for driving the bit-line-side and the source-line-side select transistors of these blocks.

Figure 2:
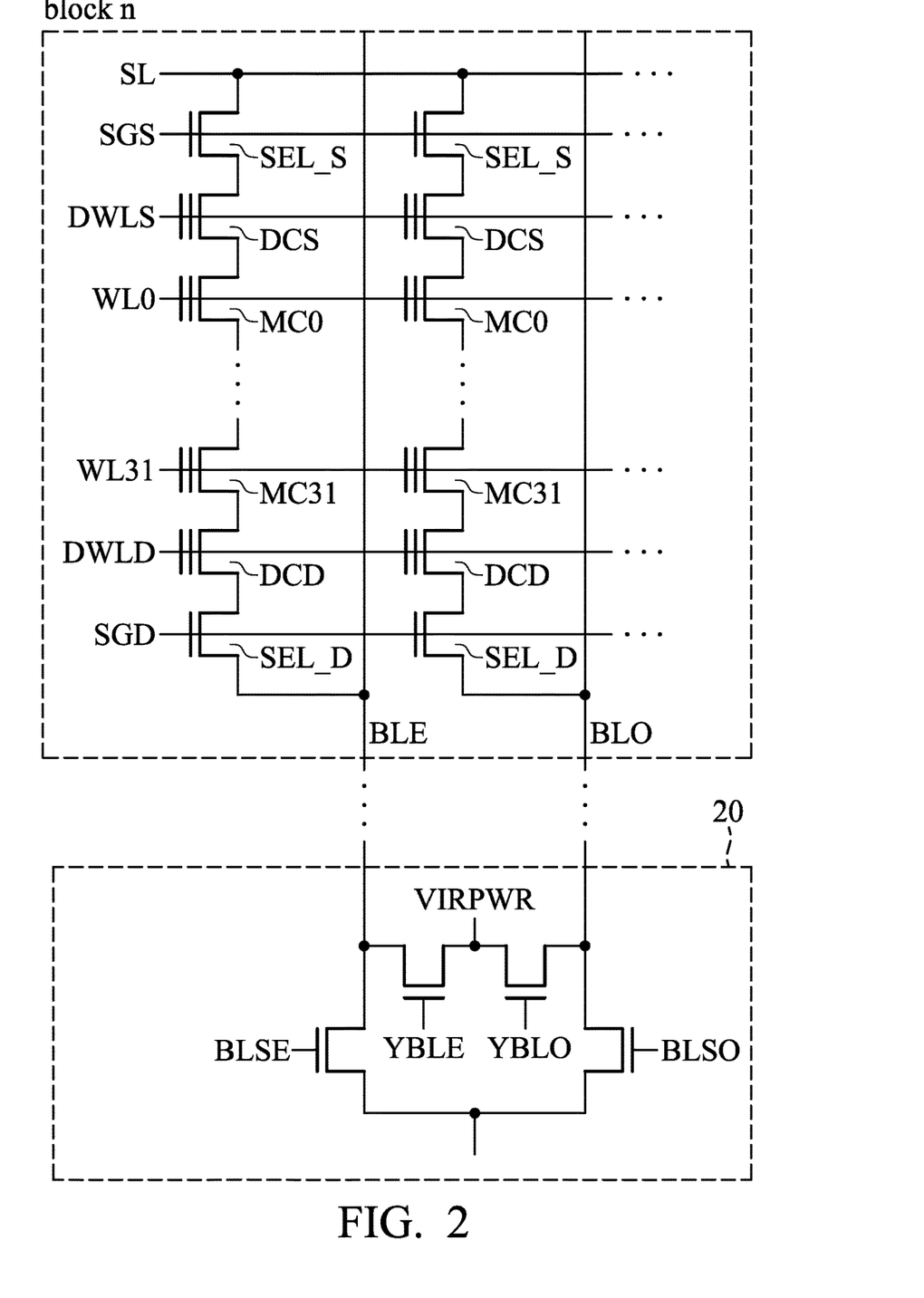
FIG. 2 shows a schematic diagram of the NAND strings of the nth block of the memory cell array, and the bit line selecting circuit connected to the NAND strings.

FIG. 2 shows a schematic diagram of the NAND string and the bit line selecting circuit of the block n. The example here illustrates one even global bit line BLE and one odd global bit line BLO each connected to the NAND string and the bit line selecting 20. Each NAND string is configured by a plurality of transistors. In other words, each NAND string comprises a bit-line-side select transistor SEL_D coupled to the global bit line BLE/BLO, a bit-line-side dummy cell DCD, a source-line-side select transistor SEL_S coupled to the source line SL, a source-line-side dummy cell DCS, and memory cells MC0~MC31 connected between the bit-line-side dummy cell DCD and the source-line-side dummy cell DCS in series.

The bit line selecting circuit 20 comprises a transistor BLSE, a transistor BLSO, a transistor YBLE, and a transistor YBLO. The transistor BLSE is used for selecting the even global bit line BLE. The transistor BLSO is used for selecting the odd global bit line BLO. The transistor YBLE is used for connecting the virtual power VIRPWR to the even global bit line BLE. The transistor YBLO is used for connecting the virtual power VIRPWR to the odd global bit line BLO.

In addition, the driving control circuits 10A and 10B of the planes P0 and P1 respectively output a select signal SGS for driving the source-line-side select transistor SEL_S, and output a select signal SGD for driving the bit-line-side select transistor SEL_D. The driving control circuits 10A and 10B control the voltage levels of the select signals SGS/SGD in response to the operation of the flash memory.

For example, when performing the reading operation, the plane P0 is the selected plane, the plane P1 is the unselected plane, and the block n is selected. The column decoder (not shown) commonly outputs the block select signal BSELn for selecting the block n to the row driving circuits X_DRVn of the planes P0 and P1. Accordingly, the passing transistors of the row driving circuits X_DRVn of the planes P0 and P1 are on. In addition, in order to prevent the driving voltage applied to the word line or the select signal SGS and SGD from dropping due to the passing transistors, the block select signal BSELn will be driven by a very high voltage (for example, higher voltage than that applied to the line).

In response to the reading command, in the selected plane P0, the driving control circuit 10A provides the select signals SGS and SGD equal to the driving voltage, so as to turn on the bit-line-side select transistor SEL_D and the source-line-side select transistor SEL_S. The row driving circuit X_DRVn applies the ground voltage (GND) to the selected word line, and it applies the reading pass voltage Vpass to the unselected word line, so as to read the data of the selected memory cell of the selected plane P0 via the page buffer/sensing circuit, and then output the read data of the selected memory cell to the external.

Figure 3:
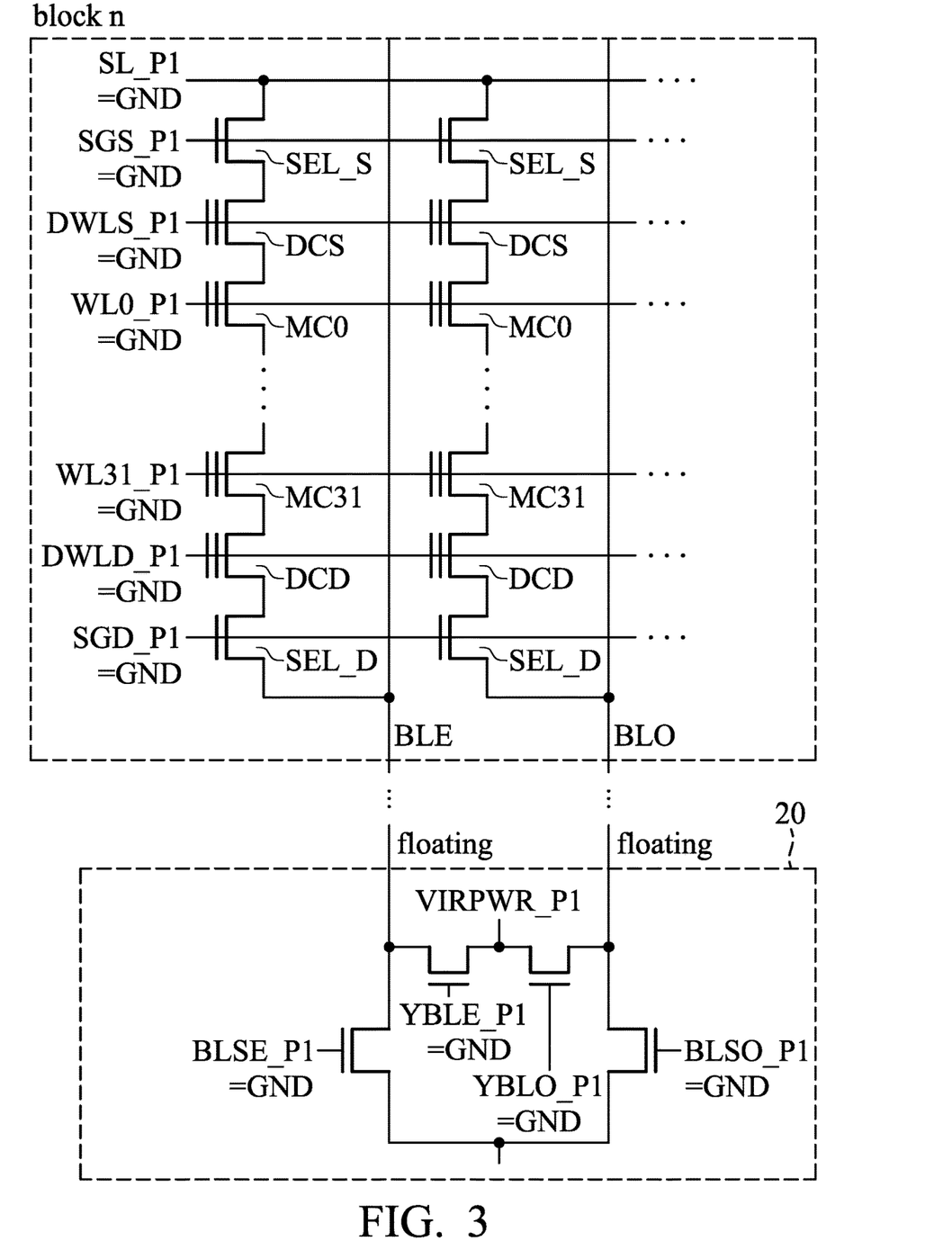
FIG. 3 shows the NAND strings in the unselected plane, and the bias voltages applied to the transistors.

On the other hand, in the unselected plane P1, the transistors are driven by the bias voltages shown in FIG. 3. The passing transistor of the row driving circuit X_DRVn is on. However, because the driving control circuit 10B provides the select signals SGS and SGD equal to the GND level, the bit-line-side select transistor SEL_D and the source-line-side select transistor SEL_S are turned off forcibly, so that the memory cells of the unselected plane P1 are not affected by the operation of the selected plane P0.

Figure 4:
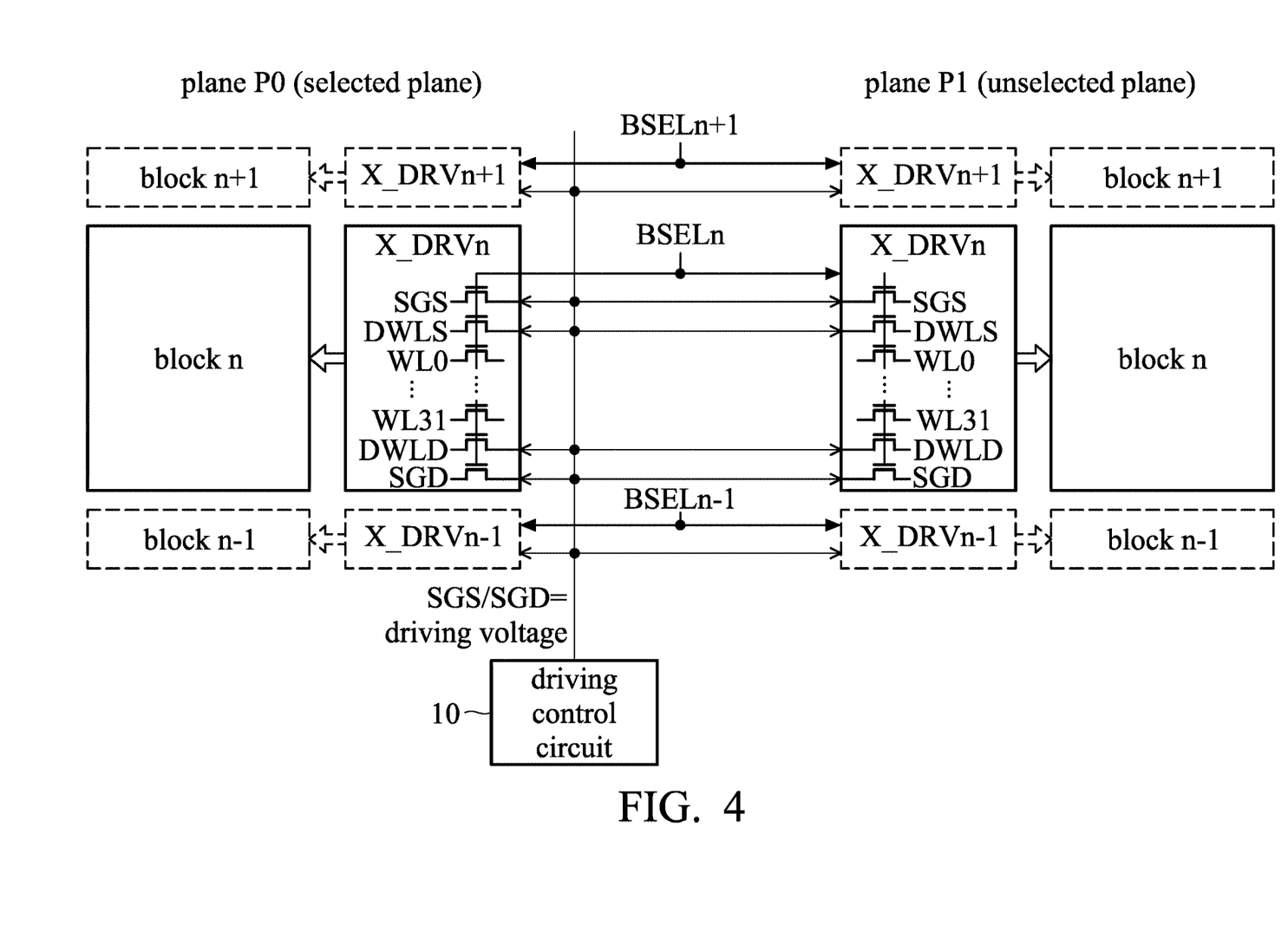
FIG. 4 shows a schematic diagram of the conventional multi-plane flash memory having a driving control circuit shared by multiple planes.

Because the driving control circuits 10A and 10B have to output the select signals SGS and SGD with high voltage during the period when the corresponding plane is selected, a high voltage transistor or a level shifter is required to switch to the high voltage bias, thereby increasing the size of the layout. In order to reduce the area, the flash memory shown in FIG. 4 has a driving control circuit 10 shared by two planes P0 and P1 for commonly outputting a select signals SGS and SGD that are equal to the driving voltage to the selected plane P0 and the unselected plane P1. Therefore, the bit-line-side select transistor SEL_D and the source-line-side select transistor SEL_S of the unselected plane P1 are both turned on and cannot be turned off forcibly, thereby causing problems with unexpected current flowing into the NAND string of the unselected plane P1, and changing cell threshold voltage distribution.

Figure 5:
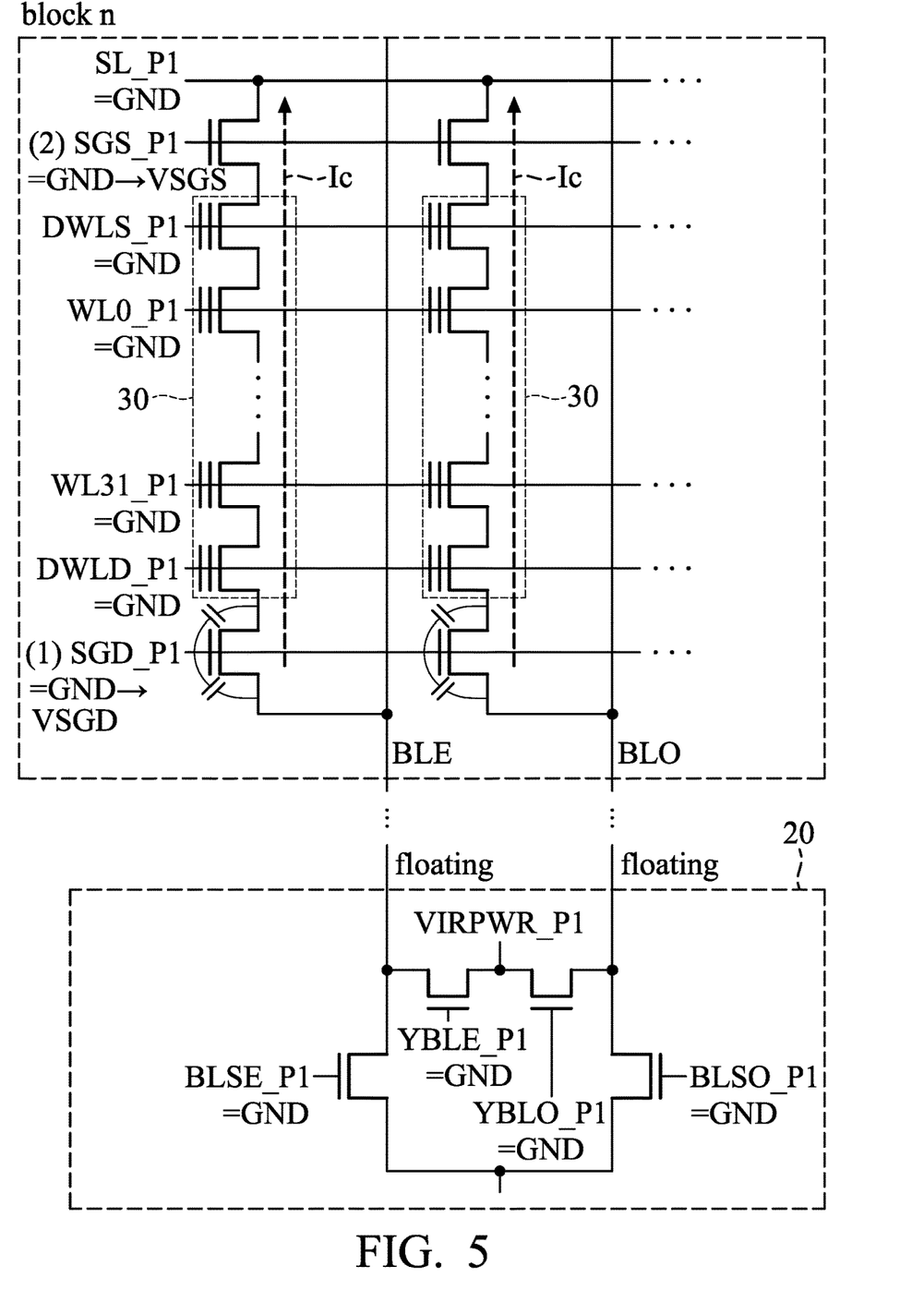
FIG. 5 shows the bias voltages applied to the transistors of the unselected plane of the flash memory shown in FIG. 4 during a reading operation.

FIG. 5 shows the bias voltages applied to the transistors of the unselected plane P1 during a reading operation. In an initial stage, each transistor (YBLE, YBLO, BLSE, and BLSO) of the bit line selecting circuit 20 connected to the unselected plane P1 is off (the gate voltage=GND), and the bit-line-side select transistor SEL_D is off (the select signal SGD=GND), so the global bit lines BLE and BLO of the unselected plane P1 are floating. After the reading operation is started, the driving control circuit 10 first sets the select signal SGD to the H level (for example, VSGD is 4.5V). However, this select signal SGD at the H level will also be provided to the bit-line-side select transistor SEL_D of the unselected plane P1, resulting in the voltage at the global bit lines BLE and BLO of the unselected plane P1 being affected by capacitive coupling with the select signal SGD. For example, the voltage at the global bit lines BLE and BLO of the unselected plane P1 may rise from 0V (default floating state) to 0.5V, or eventually to a higher voltage (depending on the capacitive coupling ratio).

Next, the driving control circuit 10 sets the select signal SGS to the H level (for example, VSGS is 4.5V). This select signal SGS will also be provided to the source-line-side select transistor SEL_S of the unselected plane P1. The dummy cells DCS and DCD are in an erased state (having negative threshold). The GND voltage is applied to the dummy word lines DWLS and DWLD. At this time, if all the memory cells 30 of the NAND string are in a deep erased state (having negative threshold), then the NAND string will generate the cell current Ic. In other words, the current will pass through the bit-line-side select transistor SEL_D and the source-line-side select transistor SEL_S, which are both turned on, and the current will flow from the global bit lines BLE/BLO to the source line SL. Even if all the word lines WL are provided with the GND voltage, there is no way to avoid such a cell current Ic. Once the cell current Ic flows in the unselected plane P1, the cell threshold voltage distribution changes, resulting in low reliability.

BRIEF SUMMARY OF THE INVENTION

To solve this conventional problem, the present invention provides a flash memory having high reliability and a method for operating the flash memory for seeking stability of memory cell threshold voltage distribution.

A method for operating a flash memory according to the present invention is provided. The flash memory includes a plurality of planes, each of the planes includes a plurality of NAND strings, each of the NAND strings includes a select transistor and a plurality of memory cells, and each of the NAND strings is arranged between a bit line and a source line. The method according to the present invention includes: selecting at least one plane among the planes; electrically connecting the bit line of an unselected plane to a reference voltage; commonly providing a gate select signal to the select transistors of the selected planes and the unselected planes after the bit line of the unselected plane is connected to the reference voltage; and reading data from the selected plane, writing data to the selected plane, or erasing data in the selected plane after the gate select signal is provided.

A flash memory according to the present invention is also provided. The flash memory includes a plurality of planes, a controller, a switch unit, and a driving control circuit. Each of the planes includes a plurality of NAND strings, each of the NAND strings includes a select transistor and a plurality of memory cells, and each of the NAND strings is arranged between a bit line and a source line. The controller is configured to select at least one plane among the planes, so as to perform a reading operation, a writing operation, or an erasing operation on the selected plane. The switch unit has a controlling terminal and is configured to electrically connect the bit line of an unselected plane to a reference voltage. The driving control circuit is configured to commonly provide a gate select signal to the transistors of the selected planes and the unselected planes after the bit line of the unselected plane has been connected to the reference voltage.

According to the present invention, by electrically connecting the bit lines of the unselected plane to the reference voltage before commonly providing the gate select signal to the select transistors of the selected planes and the unselected planes, it is possible to restrain the unexpected current occurred in the NAND string of the unselected plane during out of operation or out of selection.

BRIEF DESCRIPTION OF THE DRAWINGS

FIG. 10A is a schematic diagram showing that the cell current Iv flows from the local bit line into the virtual power via the bit-line-side select transistor which is turned on.

DETAILED DESCRIPTION OF THE INVENTION

Next, the embodiment of the present invention will be described with reference to the drawings. The semiconductor device of the present invention, for example, is a NAND-type flash memory, or a microprocessor, a microcontroller, a logic device, an application specific integrated circuit (ASIC), a video or audio processor, or a wireless signal processor which is embedded with such flash memory.

Figure 6:
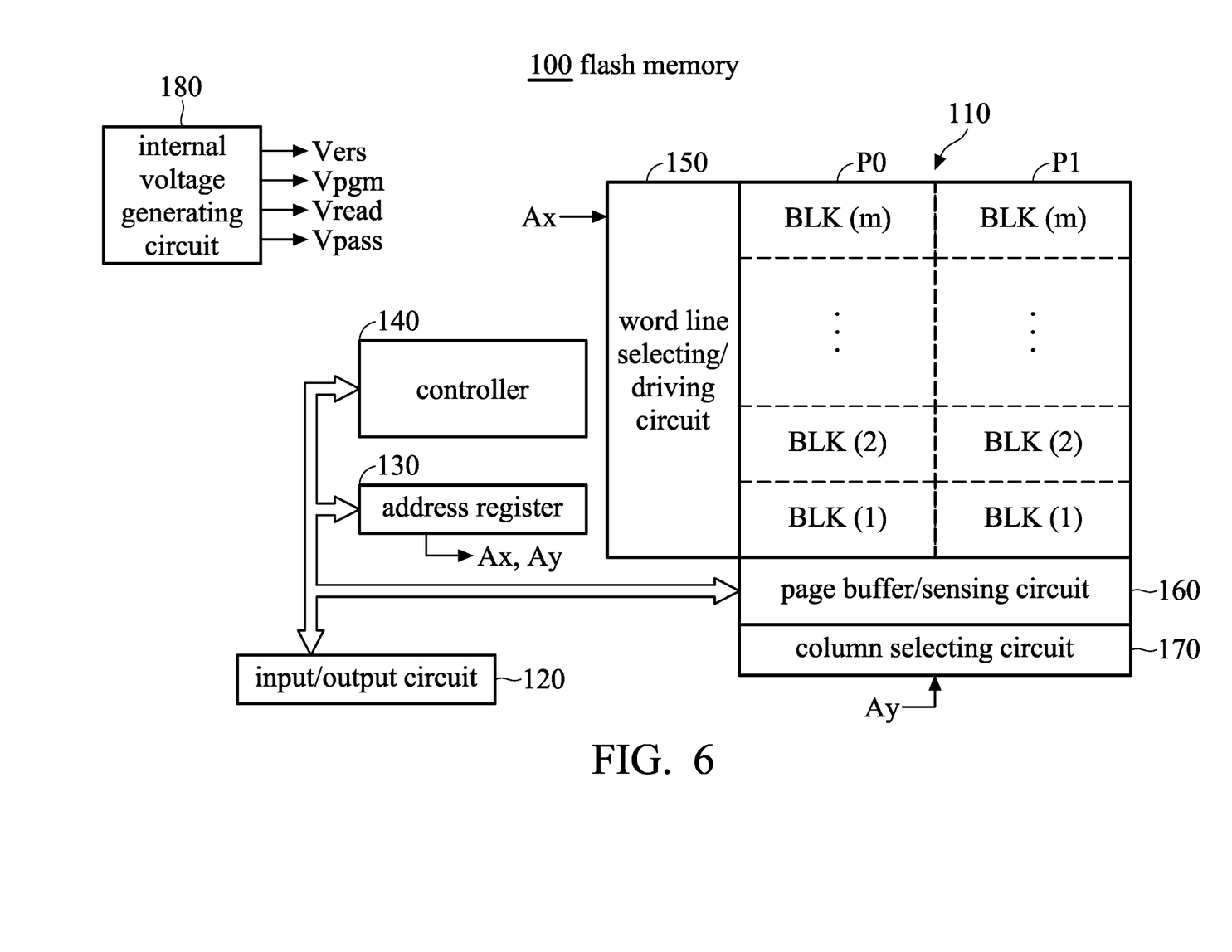
FIG. 6 shows a schematic diagram of the NAND-type flash memory according to the embodiment of the present invention.

FIG. 6 shows a schematic diagram of the multi-plane NAND-type flash memory according to one embodiment of the present invention. The flash memory 100 of this embodiment comprises a memory cell array 110, an input/output circuit 120, an address register 130, a controller 140, a word line selecting/driving circuit 150, a page buffer/sensing circuit 160, a column selecting circuit 170, and an internal voltage generating circuit 180. The memory cell array 110 comprises a plurality of planes P0 and P1. The input/output circuit 120 is connected to an external input/output terminal I/O for inputting or outputting data. The address register 130 receives address data from the input/output circuit 120. The controller 140 controls every part of the flash memory 100 based on the command or the external control signal (for example, the command latch enable signal CLE, or the address latch enable signal ALE and so on) received from the input/output circuit 120. The word line selecting/driving circuit 150 selects the block or drives the word line based on the row address information Ax from the address register 130. The page buffer/sensing circuit 160 keeps the data read from the selected page, and keeps the data to be programmed to the selected page. The column selecting circuit 170 selects data in the page buffer/sensing circuit 160 based on the column address information Ay from the address register 130. The internal voltage generating circuit 180 generates every kind of essential voltage: for reading, programming, erasing data, etc. (writing voltage Vpgm, reading pass voltage Vpass, erasing voltage Vers, reading voltage Vread, etc.)

The memory cell array 110 comprises a plurality of planes (for example, planes P0 and P1), and each plane forms m blocks in the column direction. In one block, a plurality of NAND strings are formed in the row direction as shown in FIG. 2. One NAND string comprises a source-line-side select transistor SEL_S; a source-line-side dummy cell DCS; a plurality of memory cells MC0~MC31 connected in series; a drain-line-side dummy cell DCD; and a bit-line-side select transistor SEL_D. The source-line-side select transistor SEL_S is connected to the common source line SL, and the bit-line-side select transistor SEL_D is connected to the corresponding global bit line BLE or BLO.

The word lines WL0~WL31 connected to the gates of the memory cells MC0~MC31 respectively, and the dummy word lines DWLS and DWLD connected to the gates of the dummy cells DCS and DCD respectively, are driven by the word line selecting/driving circuit 150. The word line selecting/driving circuit 150 can drive and control the word lines and the dummy word lines of the selected plane or the unselected plane separately. In addition, the select signal SGS and the select signal SGD are provided from the driving control circuit 10 (referring to FIG. 4) of the word line selecting/driving circuit 150, to the gates of the source-line-side select transistor SEL_S and the gate of the bit-line-side select transistor SEL_D. The driving control circuit 10 is shared by a plurality of planes, in other words, the driving control circuit 10 commonly provides the select signals SGS and SGD to the selected blocks of the selected planes and the unselected planes.

In addition, the NAND strings can constitute a 2-dimensional array formed on surface of the substrate, or can constitute a 3-dimensional array by using the semiconductor layer formed on the surface of the substrate. In addition, one memory cell can be an SLC (Single-level Cell)-type that stores one bit (binary data), or it can be an MLC (Multi-level Cell)-type that stores multiple bits.

The NAND strings of each block of each plane are connected to the global bit lines BLE and BLO via the bit-line-side select transistor SEL_D; and the global bit lines BLE and BLO are connected to the page buffer/sensing circuit 160 via the bit line selecting circuit 20.

Figure 7:
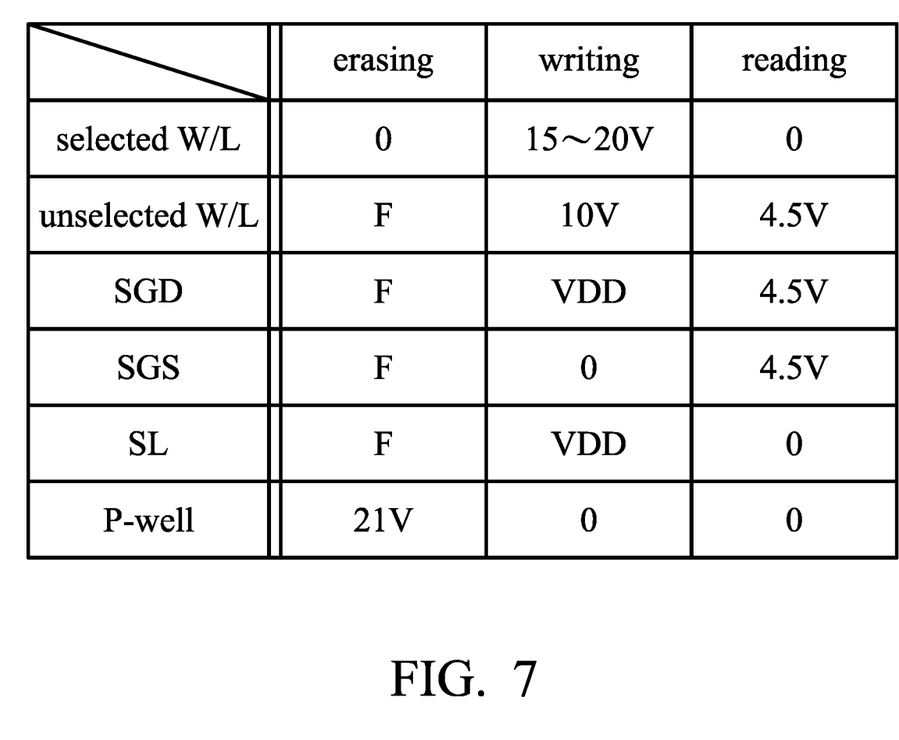
FIG. 7 shows the bias voltages applied during the operations of the NAND-type flash memory.

FIG. 7 shows the bias voltages applied during the operation of the flash memory. In a reading operation, a certain positive voltage is applied to the bit line, a certain reading voltage (for example, 0V) is applied to the selected word line, the reading pass voltage Vpass (for example, 4.5V) is applied to the unselected word line, a positive voltage (for example, 4.5V) is applied to the select signals SGD/SGS for turning on the bit-line-side select transistor SEL_D and the source-line-side select transistor SEL_S, and 0V is applied to the common source line. In a program (write) operation, the programming voltage with high voltage is applied to the selected word line (15~20V), the midpoint potential (for example, 10V) is applied to the unselected word line, the bit-line-side select transistor SEL_D is turned on by applying the select signals SGD having the operating voltage VDD level, the source-line-side select transistor SEL_S is turned off by applying the select signals SGS having the ground voltage level, and the potential corresponding to the data "0" or "1" is provided to the bit line. In the erase operation, 0V is applied to the word line in the block, and a high voltage (for example, 20V) is applied to the P-well to erase the data in block units.

For example, the multi-plane type of flash memory 100 can select one of the planes, P0 or P1, based on the input column address information Ay, or it can select both of P0 and P1 at the same time in response to the command of selecting mode. In the reading operation, programming operation, and erasing operation, the controller 140 can control the selected planes and the unselected planes respectively. The word line selecting/driving circuit 150 outputs the block select signal BSEL at the H level for selecting the block, to the passing transistors of the row driving circuit X_DRV of the selected planes and the unselected planes, thereby turning on the passing transistors. In addition, as described above, the select signals SGS and SGD output from the driving control circuit 10 are driven by the voltage corresponding to the operation of the flash memory (referring to FIG. 7), such driving voltage is provided to the selected block of the unselected plane via the passing transistors which are turned on, and causes the unexpected cell current Ic to flow into the NAND strings of the unselected plane (referring to FIG. 5).

To restrain the unexpected cell current Ic flowing into the NAND string of the unselected plane, one embodiment of the present invention connects the global bit lines of the unselected plane to the reference voltage (for example, the GND level), thereby preventing the voltage on the global bit lines in the floating state raised due to capacitive coupling.

Figure 8:
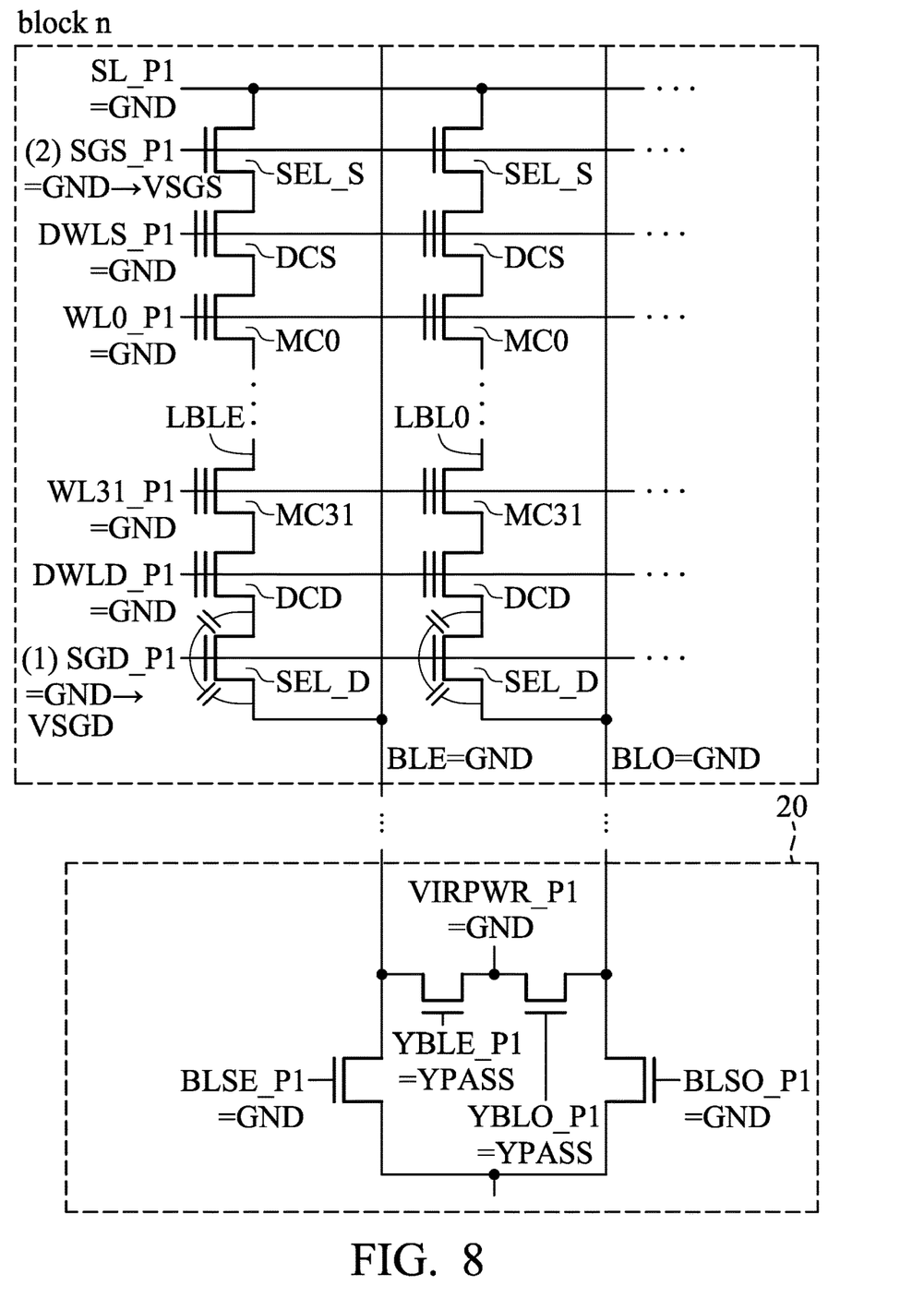
FIG. 8 shows a method for controlling the unselected plane according to the embodiment of the present invention.

FIG. 8 shows a method for controlling the global bit lines of the unselected plane according to the embodiment. Here, assuming that the plane P0 is the selected plane, the plane P1 is the unselected plane, and the reading of the selected page of the selected block n is performed on the plane P0.

As shown in FIG. 8, in this embodiment, the global bit lines BLE and BLO of the unselected plane P1 are electrically connected to the virtual power VIRPWR at the GND level via the bit line selecting circuit 20. The controller 140 is configured to control the bit line selecting circuit 20 connected to the global bit lines BLE and BLO of the unselected plane via the page buffer/sensing circuit 160; in detail, the page buffer/sensing 160 is configured to apply the voltage YPASS of H level (for example, a voltage higher than the supply voltage VDD) to the transistors YBLE/YBLO in the bit line selecting circuit 20, so as to electrically connect the even global bit line BLE and the odd global bit line BLO to the virtual power VIRPWR at the GND level. In addition, FIG. 8 shows one pair of the even global bit line BLE and the odd global bit line BLO, but in fact, all the global bit lines of the unselected plane are electrically connected to the virtual power VIRPWR at the GND level via the bit line selecting circuit 20.

Figure 9:
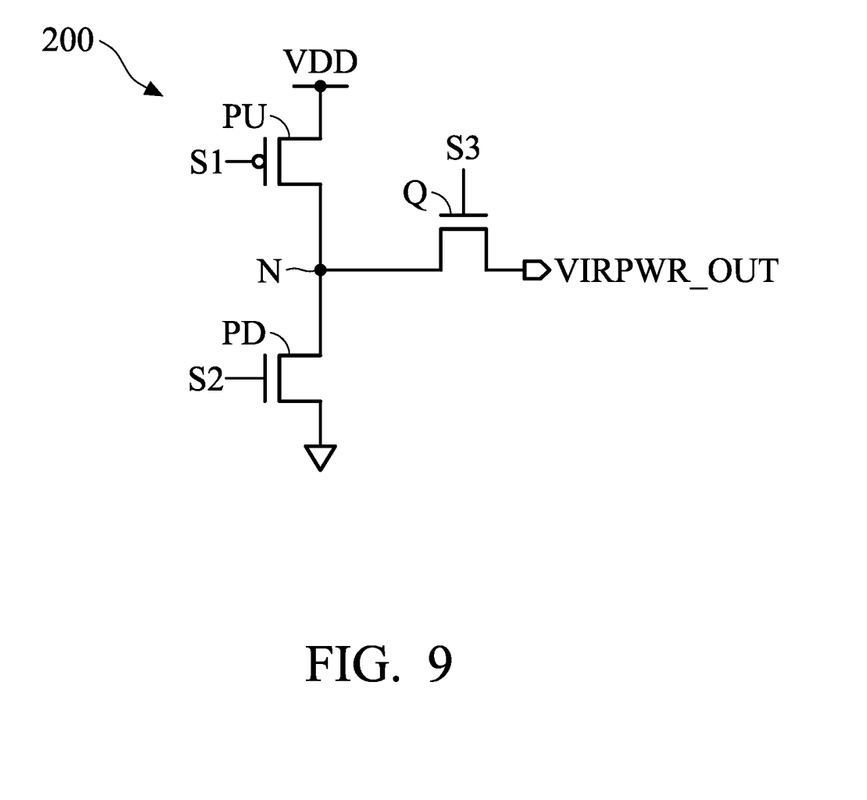
FIG. 9 is a schematic diagram showing the virtual power drive circuit according to the first embodiment of the present invention.

FIG. 9 shows the virtual power drive circuit for providing the virtual power VIRPWR according to the first embodiment of the present invention. The virtual power drive circuit 200 comprises a P-type pull-up transistor PU, an N-type pull-down transistor PD, and an N-type transistor Q. The P-type pull-up transistor PU is connected between the supply voltage VDD and the output node N. The N-type pull-down transistor PD is connected between the output node N and the GND level. The N-type transistor Q is connected between the output node N and the output terminal VIRPWR OUT. The controller 140 applies control signals S1, S2 and S3 to the gates of the pull-up transistor PU, the pull-down transistor PD and the transistor Q, respectively. For the virtual power drive circuit 200 connected to the unselected plane, the controller 140 is configured to provide the corresponding control signals S1, S2 and S3, so as to turn off the pull-up transistor PU, and turn on the pull-down transistor PD and the transistor Q, such that the output terminal VIRPWR OUT provides the GND level. On the other hand, for the virtual power drive circuit 200 connected to the selected plane, the controller 140 drives the control signals S1, S2 and S3 to the H level or the L level in response to the corresponding operation, such that the output terminal VIRPWR OUT provides the supply voltage VDD or the GND level.

By using this method, all the global bit lines BLE and BLO of the unselected plane P1 are electrically connected to the virtual power VIRPWR providing the GND level the transistors YBLE and YBLO which are turned on, so that the global bit lines BLE and BLO which are not selected to perform operations are not in a floating state, but are fixed at the GND level.

After the reading operation is started, firstly, in the selected plane P0, the global bit lines BLE and BLO and the local bit lines LBLE and LBLO are pre-charged by the page buffer/sensing circuit 160. The local bit line LBLE/LBLO is the path from the global bit line BLE/BLO to the source line SL in the NAND string. In order to pre-charge the global bit lines BLE and BLO and the local bit lines LBLE and LBLO, the driving control circuit 10 (referring to FIG. 4) drives the select signal SGD which is commonly provided to the selected plane P0 and the unselected plane P1 from the GND level to the H level (for example, VSGD=4.5V). The driving voltage VSGD is applied to the gates of the bit-line-side select transistors SEL_D of the selected plane P0 and the unselected plane P1, so as to turn on the bit-line-side select transistors SEL_D. Because the voltage on the global bit lines BLE and BLO of the unselected plane P1 is not in a floating state, but is fixed at the GND level, it will not rise due to the select signal SGD with the driving voltage VSGD. In other words, the capacitive coupling between the gate of the bit-line-side select transistor SEL_D and the global bit line BLE/BLO can be ignored.

Next, in the selected plane P0, the pre-charged global bit lines BLE and BLO and the local bit lines LBLE and LBLO starts to be discharged. In order to discharge these bit lines, the driving control circuit 10 drives the select signal SGS commonly provided to the selected plane P0 and the unselected plane P1 from the GND level to the H level (for example, VSGS=4.5V). The driving voltage VSGS is applied to the gates of the source-line-side select transistors SEL_S of the selected plane P0 and the unselected plane P1, so as to turn on the source-line-side select transistors SEL_S. At this time, even if the memory cells MC0~MC31 and the dummy cells DCS and DCD are in the strong erased state (with threshold), because the global bit lines BLE and BLO of the unselected plane P1 are at the GND level, the cell current Ic flowing from the global bit lines BLE and BLO into the source line SL can be prevented. Therefore, the present invention prevents the change of the threshold distribution of the memory cells in the unselected plane P1.

Next, other embodiments of the present invention will be described. In the above embodiment, by providing the GND voltage to the global bit lines BLE and BLO of the unselected plane, it can prevent the cell current Ic flowing from the global bit lines BLE and BLO into the source line SL. However, when the voltage of the local bit lines LBLE and LBLO rises due to capacitive coupling, it is possible for the cell current Iv (shown as FIG. 10A) to flow from the local bit line LBLE/LBLO to the virtual power VIRPWR via the bit-line-side select transistor SEL_D, the global bit lines BLE/BLO and the bit line selecting circuit 20.

In order to perform shield reading during reading operation, the virtual power drive circuit 200 connected to the virtual power VIRPWR of the selected plane P0 discharges the unselected bit line of the even page or the odd page to the GND level, and connects the selected bit line to the supply voltage VDD. In order to increase the wiring capacity of the global bit line, and discharge the unselected bit line to the GND level in a short time, the pull-down transistor PD of the virtual power drive circuit 200 which is connected to the selected plane needs high driving ability. However, for the unselected plane P1, if the cell current Iv is discharged via the pull-down transistor PD with high driving ability, the cell current Iv will flow out rapidly, causing the increase of the voltage variation of the local bit lines LBLE and LBLO, and affecting the threshold of the memory cells of the unselected plane P1.

Figure 10A:
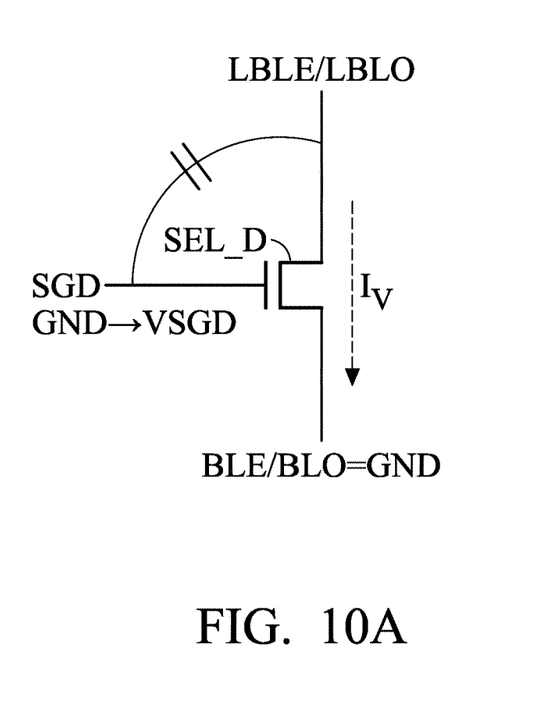
Figure 10B:
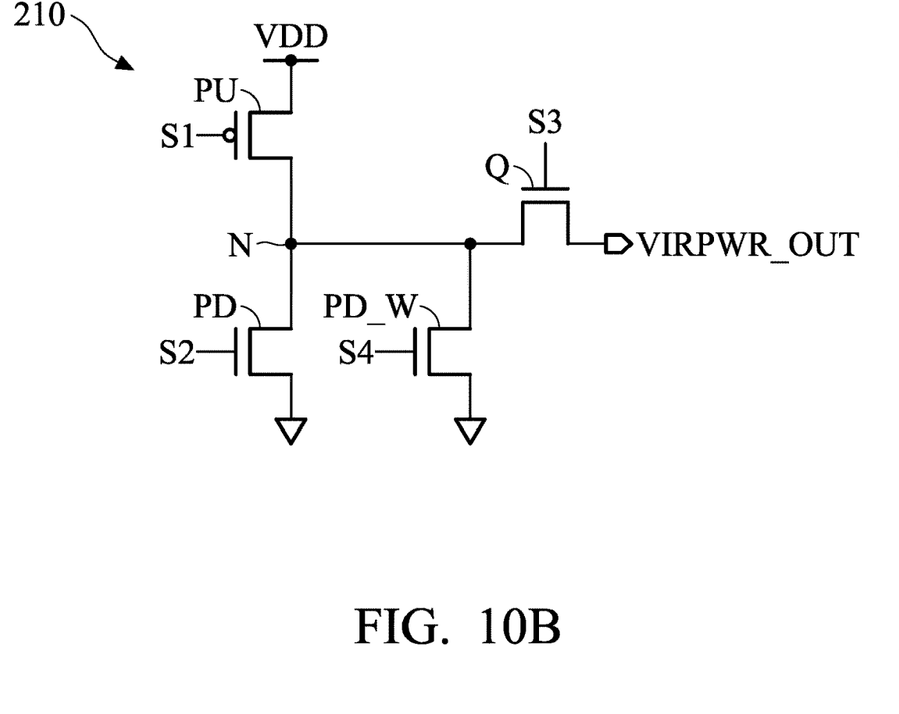
FIG. 10B is a schematic diagram showing the virtual power drive circuit according to the second embodiment of the present invention.

In order to solve the above problem, FIG. 10B shows the virtual power drive circuit according to the second embodiment of the present invention, in the virtual power circuit 210, there are two pull-down transistors PD W and PD arranged in parallel between the pull-up transistor PU and the ground voltage, wherein the driving ability of the pull-down transistor PD W is worse than that of the pull-down transistor PD, and the cell current Iv is discharged by using the pull-down transistor PD W with low driving ability. As one method to make the driving ability of the transistors different, the width length ratio (W/L) of the pull-down transistor PD W can be smaller than that of the pull-down transistor PD. By using this method, the drain current flowing when the pull-down transistor PD W is turned on is smaller than the drain current flowing when the pull-down transistor PD is turned on. In this case, the pull-down transistors PD and PD W can be turned on by the same gate voltage. In addition, as another method to make the driving ability of the transistors different, the gate voltage for driving (turning on) the pull-down transistor PD W is smaller than the gate voltage for driving the pull-down transistor PD, so that the drain current flowing through the pull-down transistor PD W becomes smaller, and the driving ability of the pull-down transistor PD W is worse than that of the pull-down transistor PD. For example, the bias voltage controlled by the current mirror circuit can be applied to the gate of the pull-down transistor PD W with low driving ability, so as to make the drain current flowing therefrom become a constant current. In addition, the above two methods can be used at the same time to make the driving ability of the transistors different.

Next, the operation according to this embodiment will be described. As shown in FIG. 10A, in the virtual power drive circuit 200 according to the present invention, when the select signal SGD of the unselected plane P1 is driven from the GND level to the H level (for example, VSGD=4.5V), there is almost no coupling effect between the gate of the bit-line-side select transistor SEL_D and the global bit line BLE/BLO. However, before the bit-line-side select transistor SEL_D is turned on, in other words, the voltage VSGD of the signal SGD is smaller than the threshold of the bit-line-side select transistor SEL_D (VSGD<Vth), the voltage of the local bit line LBLE/LBLO is in the floating state. Therefore, the voltage of the local bit line LBLE/LBLO may rise slightly due to capacitive coupling between the gate of the bit-line-side select transistor SEL_D and the local bit line LBLE/LBLO. Then, when the bit-line-side select transistor SEL_D is turned on, the cell current Iv flows from the local bit lines LBLE and LBLO to the virtual power VIRPWR at the GND level via the bit-line-side select transistor SEL_D.

In order to solve the above problem, as shown in FIG. 10B, the virtual power drive circuit 210 is configured to turn off the pull-up transistor PU and the pull-down transistor PD with high driving ability connected to the unselected plane P1 in response to the control signals S1 and S2; and to turn on the pull-down transistor PD W with low driving ability and the transistor Q in response to the control signals S3 and S4. By using this method, the discharging speed and the discharging amount of the cell current Iv are limited, so as to restrain the sudden voltage variation on the local bit lines LBLE and LBLO of the unselected plane P1. Therefore, the affect from the cell current Iv to the memory cells can be as smaller as possible. The voltage of the control signal S4 can also be the same as that of the control signal S3. As described above, in case the driving abilities of the pull-down transistors PD W and PD are different by providing the different gate driving voltages, the control signal S4 can also be generated by the current mirror circuit which is not shown in the figures, so as to reduce the drain current flowing through the pull-down transistor PD W.

On the other hand, in one embodiment, for example, while performing shield reading, the virtual power drive circuit 210 connected to the selected plane P0 can turn on both of the pull-down transistor PD with high driving ability and the pull-down transistor PD W with low driving ability in response to the control signals S2 and S4, so as to the unselected bit line to the GND level in a short time.

In the above embodiment, the flash memory having two planes is exemplified; however, the number of planes is not limited to two, and can be greater than or equal to three. For example, when the number of planes is four, it is possible to provide two driving control circuits in the flash memory, wherein one driving control circuit is shared by two planes and the other driving control circuit is shared by another two planes. However, it is also possible to design one driving control circuit shared by four planes.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for operating a flash memory comprising a plurality of planes, each of the planes comprising a plurality of NAND strings, each of the NAND strings comprising a select transistor and a plurality of memory cells, and each of the NAND strings being arranged between a bit line and a source line, the method comprising:
   selecting at least one plane among the planes;
   electrically connecting the bit line of an unselected plane to a reference voltage;
   commonly providing a gate select signal to the select transistors of the selected planes and the unselected planes after the bit line of the unselected plane is connected to the reference voltage; and
   reading data from the selected plane, writing data to the selected plane, or erasing data in the selected plane after the gate select signal is provided.

2. The method as claimed in claim 1,
   wherein the step of electrically connecting the bit line of the unselected plane to the reference voltage comprises:
   providing the reference voltage via a virtual power drive circuit; and
   turning on a transistor arranged between the bit line and a virtual power in a bit line selecting circuit connected to the unselected plane, so as to connect the bit line to the reference voltage provided by the virtual power drive circuit via the transistor.

3. The method as claimed in claim 2,
   wherein the bit line comprises an even bit line and an odd bit line, and the method further comprises using a page buffer/sensing circuit to control the bit line selecting circuit, so as to connect both of the even bit line and the odd bit line of the unselected plane to the reference voltage,
   wherein the reference voltage is a ground voltage, and the voltage to turn on the transistor is greater than a supply voltage.

4. The method as claimed in claim 2,
   wherein the step of providing the reference voltage via the virtual power drive circuit comprises:
   providing a first pull-down transistor and a second pull-down transistor arranged in parallel in the virtual power drive circuit, the first pull-down transistor and the second pull-down transistor being connected to the reference voltage, and the driving ability of the first pull-down transistor being better than that of the second pull-down transistor; and
   turning on the second pull-down transistor, and turning off the first pull-down transistor.

5. The method as claimed in claim 4,
   wherein the selecting transistor comprises a bit-line-side select transistor and a source-line-side select transistor, the step of providing the gate select signal to the selecting transistors of the selected planes and the unselected planes comprises:
   commonly providing the gate select signal to the bit-line-side select transistors of the selected planes and the unselected planes, so as to turn on the bit-line-side select transistors;
   pre-charging the bit line of the selected plane via the bit-line-side select transistor which is turned on;

commonly providing the gate select signal to the source-line-side select transistors of the selected planes and the unselected planes after the bit line of the selected plane is pre-charged, so as to turn on the source-line-side select transistor; and discharging the bit line of the selected plane via the source-line-side select transistor which is turned on.

6. The method as claimed in claim 5, further comprising:

providing a first control signal to the gate of the first pull-down transistor of the virtual power drive circuit which is connected to an unselected bit line of the selected plane, so as to turn on the first pull-down transistor, and providing a second control signal to the gate of the second pull-down transistor of the virtual power drive circuit which is connected to the unselected bit line of the selected plane, so as to turn on the second pull-down transistor.

7. A flash memory, comprising:

a plurality of planes, each of the planes comprising a plurality of NAND strings, each of the NAND strings comprising a select transistor and a plurality of memory cells, and each of the NAND strings being arranged between a bit line and a source line;

a controller, configured to select at least one plane among the planes, so as to perform a reading operation, a writing operation, or an erasing operation on the selected plane;

a switch unit, having a control terminal and configured to electrically connect the bit line of an unselected plane to a reference voltage; and a driving control circuit, configured to commonly provide a gate select signal to the select transistors of the selected planes and the unselected planes after the bit line of the unselected plane being connected to the reference voltage.

8. The flash memory as claimed in claim 7, further comprising:

a virtual power drive circuit, configured to provide the reference voltage; and a bit line selecting circuit, connected between the bit line and the virtual power drive circuit, and comprising the switch unit;

wherein the switch unit comprises a transistor.

9. The flash memory as claimed in claim 8, further comprising a page buffer/sensing circuit, wherein the bit line is connected to the page buffer/sensing circuit via the bit line selecting circuit;

wherein the bit line comprises an even bit line and an odd bit line;

wherein the page buffer/sensing circuit controls the bit line selecting circuit, so as to connect both of the even bit line and the odd bit line of the unselected plane to the reference voltage, wherein the reference voltage is a ground voltage, and the voltage to turn on the transistor is greater than a supply voltage.

10. The flash memory as claimed in claim 8, wherein the virtual power drive circuit comprises a first pull-down transistor and a second pull-down transistor, the first pull-down transistor and the second pull-down transistor are arranged in parallel in the virtual power drive circuit, the first pull-down transistor and the second pull-down transistor are connected to the reference voltage, and the driving ability of the first pull-down transistor is better than that of the second pull-down transistor;

wherein the virtual power drive circuit connected to the unselected plane is configured to turn on the second pull-down transistor, and turn off the first pull-down transistor.

11. The flash memory as claimed in claim 10, wherein the selecting transistor comprises a bit-line-side select transistor and a source-line-side select transistor;

wherein the driving control circuit commonly provides the gate select signal to the bit-line-side select transistors of the selected planes and the unselected planes, so as to turn on the bit-line-side select transistors, and the virtual power drive circuit pre-charges the bit line of the selected plane via the bit-line-side select transistor which is turned on;

wherein the driving control circuit commonly provides the gate select signal to the source-line-side select transistors of the selected planes and the unselected planes after the bit line of the selected plane is pre-charged, so as to turn on the source-line-side select transistors, and the virtual power drive circuit discharges the bit line of the selected plane via the source-line-side select transistor which is turned on.

12. The flash memory as claimed in claim 10, wherein the controller is configured to:

provide a first control signal to the gate of the first pull-down transistor of the virtual power drive circuit which is connected to an unselected bit line of the selected plane, so as to turn on the first pull-down transistor; and provide a second control signal to the gate of the second pull-down transistor of the virtual power drive circuit which is connected to the unselected bit line of the selected plane, so as to turn on the second pull-down transistor.

* * * * *